(12) United States Patent
Yabu et al.

(10) Patent No.: US 10,008,361 B2
(45) Date of Patent: Jun. 26, 2018

(54) CHARGED PARTICLE BEAM DEVICE AND INSTALLATION METHOD

(71) Applicant: HITACHI HIGH-TECHNOLOGIES CORPORATION, Minato-ku, Tokyo (JP)

(72) Inventors: Shuhei Yabu, Tokyo (JP); Naoto Koga, Tokyo (JP); Mitsuo Akatsu, Tokyo (JP); Isao Takahira, Tokyo (JP); Shinichi Tomita, Tokyo (JP); Hiroyuki Noda, Tokyo (JP); Ai Masuda, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 71 days.

(21) Appl. No.: 15/318,455

(22) PCT Filed: Mar. 4, 2016

(86) PCT No.: PCT/JP2016/056694
§ 371 (c)(1),
(2) Date: Dec. 13, 2016

(87) PCT Pub. No.: WO2016/174921
PCT Pub. Date: Nov. 3, 2016

(65) Prior Publication Data
US 2017/0169988 A1 Jun. 15, 2017

(30) Foreign Application Priority Data
Apr. 28, 2015 (JP) .................. 2015-091732

(51) Int. Cl.
*H01J 37/26* (2006.01)
*G21K 5/00* (2006.01)
*H01J 37/16* (2006.01)
*H01J 37/248* (2006.01)

(52) U.S. Cl.
CPC ............ *H01J 37/16* (2013.01); *H01J 37/248* (2013.01); *H01J 37/26* (2013.01)

(58) Field of Classification Search
CPC .......... H01J 37/16; H01J 37/248; H01J 37/26
USPC ............. 250/306, 307, 309, 310, 311, 492.1, 250/492.2, 492.3
See application file for complete search history.

(56) References Cited

U.S. PATENT DOCUMENTS

| | | | | |
|---|---|---|---|---|
| 5,160,847 A | * | 11/1992 | Leavitt ................. | A61N 5/1042 250/492.3 |
| 2012/0127299 A1 | | 5/2012 | Ohtaki et al. | |
| 2013/0234582 A1 | * | 9/2013 | Ishiguro ................ | H01J 35/065 313/293 |
| 2016/0040288 A1 | * | 2/2016 | Wu .................... | C23C 16/45544 427/255.28 |

FOREIGN PATENT DOCUMENTS

WO  WO 2011/013323 A1  2/2011

* cited by examiner

*Primary Examiner* — Nicole Ippolito
(74) *Attorney, Agent, or Firm* — Miles & Stockbridge P.C.

(57) ABSTRACT

Provided is a charged particle beam device that is small, high performance, and easy to transport. A charged particle beam device (100) is provided with a detachable body unit (15) and an auxiliary unit (14), the body unit (15) housing a functional unit related to charged particle beams, and the auxiliary unit (14) housing a power source unit (9).

19 Claims, 8 Drawing Sheets

CHARGED PARTICLE BEAM DEVICE AND INSTALLATION METHOD

TECHNICAL FIELD

The present invention relates to a charged particle beam apparatus.

BACKGROUND ART

A scanning electron microscope (SEM) scans a sample with a converged electron beam, detects an electron generated from the sample by the scanning, and displays a scanning electron image of the sample on an image display device by using a detected signal thereof. The scanning electron microscope requires a high voltage of several tens of kilovolts in view of properties of an electron gun used in generating an electron beam. In addition, in order to secure a stable electron beam, the inside of the electron microscope has to remain evacuated, Therefore, the scanning electron microscope in the related art tends to increase in size.

PTL 1 below discloses a configuration of an electron microscope (refer to FIG. 2). In the electron microscope disclosed in PTL 1, an electron microscope main body including an electron source, an electron optical system, a sample chamber, a stage, and an exhaust system, a control device for controlling the electron microscope main body, and a monitor for displaying an observation image are respectively held in separate frames.

PTL 1 below further discloses a structure of a desktop electron microscope which can be installed on a table or a workbench (refer to FIG. 1). In the desktop electron microscope, the electron microscope main body including the electron source, the electron optical system, the sample chamber, the stage, and the exhaust system, and the control device are installed inside the same housing.

CITATION LIST

Patent Literature

PTL 1: Pamphlet of International Publication No. WO2011/013323

SUMMARY OF INVENTION

Technical Problem

According to a configuration illustrated in FIG. 2 in PTL 1, it is possible to provide an apparatus having excellent performance. However, since the size is large and the installation area is large, it is necessary to secure a wide installation space. In addition, when the apparatus is moved, it is essential to prepare a transport machine such as a lifter. When the apparatus is transported, a large truck needs to transport the apparatus. Thus, the transportation is time-consuming. Therefore, in a case where it is necessary to observe a sample prepared in a place having no electron microscope, the sample has to be observed after being transported to a research institute having the electron microscope. From a viewpoint of time, a user feels inconvenient.

The desktop electron microscope illustrated in FIG. 1 in PTL 1 requires a smaller installation area and is easily transported. On the other hand, in view of the property that desktop installation is available, it is necessary to limit the performance of the apparatus in order to miniaturize the apparatus.

The present invention is made in view of the above-described problem, and an object thereof is to provide a charged particle beam apparatus which is miniaturized, shows excellent performance, and is easily transported.

Solution to Problem

The present invention relates to a charged particle beam apparatus configured so that a main body unit having a functional unit relating to a charged particle beam is detachably mounted on an auxiliary unit having a power supply unit for supplying power to the main body unit.

Advantageous Effects of Invention

According to the present invention, the main body unit is miniaturized. Accordingly, it is possible to provide the charged particle beam apparatus which is miniaturized and shows excellent performance. In addition, the main body unit and the auxiliary unit are separated from each other. Accordingly, the charged particle beam apparatus can be easily transported.

DESCRIPTION OF EMBODIMENTS

Embodiment 1

Figure 1:
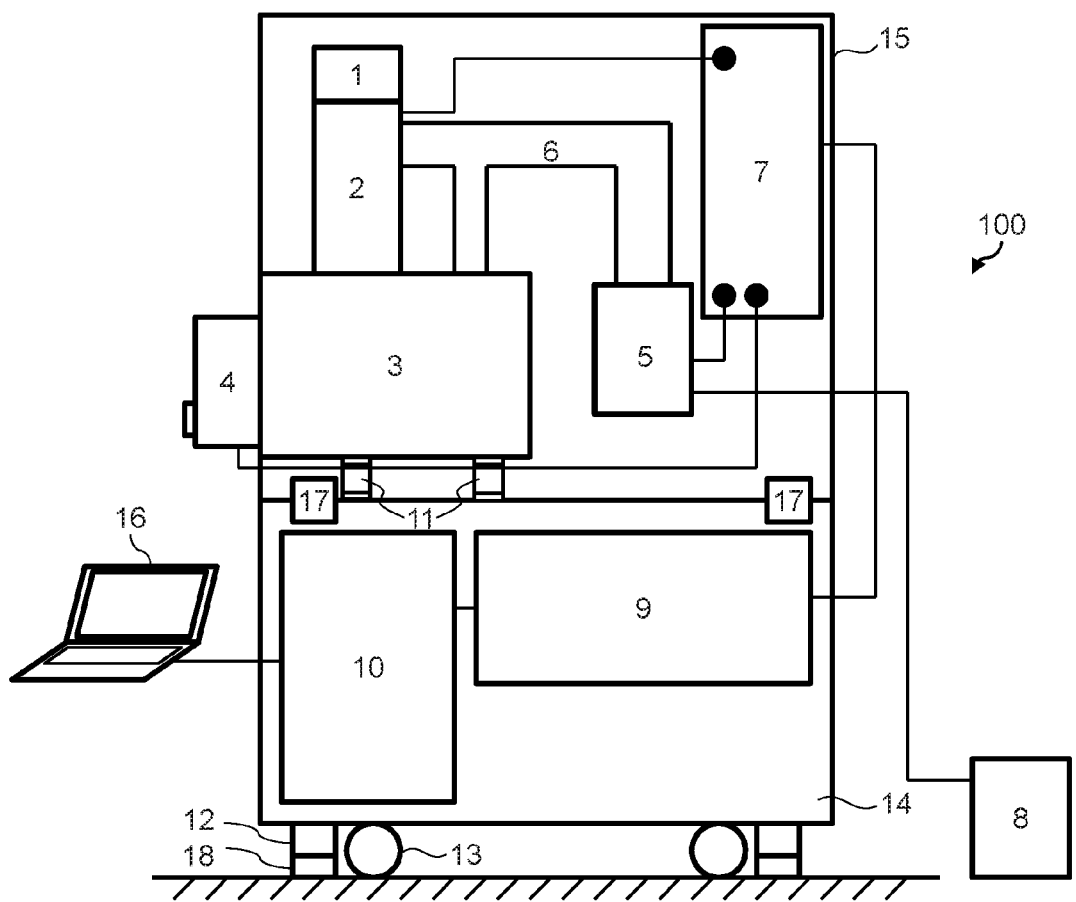
FIG. 1 is a side view illustrating an overall configuration of a charged particle beam apparatus 100 according to Embodiment 1.

FIG. 1 is a side view illustrating an overall configuration of a charged particle beam apparatus 100 according to Embodiment 1. The charged particle beam apparatus 100 includes a main body unit 15 and an auxiliary unit 14. The main body unit 15 accommodates a charged particle beam source 1, an electron optical system column 2 (including a focusing lens, an objective lens, and a detector), a sample chamber 3, a sample stage 4, a turbo-molecular pump 5 (main exhaust pump), an exhaust pipe 6 which connects the turbo-molecular pump 5 and the electron optical system column 2 or the sample chamber 3, and a control board 7 which controls each unit. The auxiliary unit 14 accommodates a power supply unit 9 and a control board 10 which communicates with a computer 16.

A leg portion 12 for installing the auxiliary unit 14 and a caster 13 for transporting the auxiliary unit 14 are provided in a lower portion of the auxiliary unit 14. A transport member other than the caster 13 may be used. A rotary pump 8 is an auxiliary exhaust pump, is installed outside the main body unit 15 and the auxiliary unit 14, and is connected to the turbo-molecular pump 5 via the exhaust pipe.

The main body unit 15 can be mounted on an upper portion of the auxiliary unit 14. In this case, the main body unit 15 and the auxiliary unit 14 are fastened by a fastening member 17, The main body unit 15 and the auxiliary unit 14 are installed so as to overlap each other. In this manner, without securing an installation area of the main body unit 15, the overall charged particle beam apparatus 100 can be installed in only an installation area of the auxiliary unit 14.

It is desirable that a footprint of the main body unit 15 is configured to be substantially the same as a footprint of the auxiliary unit 14. Specifically, it is conceivable that a bottom area of the main body unit 15 is substantially equal to (or smaller than) a top surface area of the auxiliary unit 14. In this manner, even in a state where the two units are stacked on each other, a user can obtain a sense of unity as the overall charged particle beam apparatus 100.

The main body unit 15 and the auxiliary unit 14 are fastened to each other using the fastening member 17. In this manner, all of the main body unit 15 and the auxiliary unit 14 can be regarded as one rigid body. When the charged particle beam apparatus 100 receives an external force F, an acceleration speed a received by the charged particle beam apparatus 100 can be expressed by "a=F/m" if the weight of the charged particle beam apparatus 100 is set to m. That is, the two units are fastened to each other, thereby increasing m. Compared to a case where the two units overlap each other without being fastened, it is possible to reduce the influence of vibrations when the external force is received.

Some configuration elements such as the turbo-molecular pump 5 have limitations on an operation temperature (for example, 60° C. or lower). If the charged particle beam apparatus 100 is miniaturized, the respective configuration elements are close to each other. Accordingly, heat generated from the control board 10 or the electron optical system column 2 is accumulated inside the apparatus, and the temperature inside the apparatus is likely to rise. If the temperature inside the apparatus exceeds the operation temperature, the configuration elements are stopped or are abnormally operated. The control board 10 or the power supply unit 9 which generates a large amount of heat is disposed inside the auxiliary unit 14. In this manner, it is possible to prevent the temperature rise inside the main body unit 15. In addition, it is possible to reduce the number of waste heat fans installed inside the main body unit 15. The waste heat fan which is a vibration source can be kept away from the electron optical system column 2. Furthermore, there are provided plates for partitioning each unit such as a bottom plate of the main body unit 15 and an upper plate of the auxiliary unit 14. Accordingly, a configuration can be adopted in which heat or electromagnetic noise generated from the auxiliary unit 14 is less likely to be transferred to the main body unit 15.

If vibrations are generated in the sample chamber 3 or the electron optical system column 2, the performance of the charged particle beam apparatus 100 is adversely affected. For example, in a case where the charged particle beam apparatus 100 is configured to serve as a scanning electron microscope, an image is inaccurately observed. In particular, in order to perform high magnification observation, it is necessary that the charged particle beam apparatus 100 is less likely to receive the influence of external vibrations. Therefore, a vibration control mount 11 is disposed between the bottom surface of the main body unit 15 and the sample chamber 3. For example, the vibration control mount 11 can be configured to include a vibration absorbing member such as a damper. The vibration control mount 11 can restrain the external vibrations from being propagated to the sample chamber 3 or the electron optical system column 2.

The leg portion 12 includes a vibration control mechanism 18. For example, the vibration control mechanism 18 can be configured using a vibration absorbing member such as rubber. The vibration control mechanism 18 can restrain vibrations generated on the ground from being propagated to the auxiliary unit 14 or the main body unit 15. As a result, it is possible to minimize vibrations propagated to the sample chamber 3 or the electron optical system column 2.

The caster 13 is disposed in the lower portion of the auxiliary unit 14. The caster 13 can concurrently transport the auxiliary unit 14 and the main body unit 15 in a state where the two units overlap each other (or in a state where the two units are further fastened to each other by the fastening member 17).

Figure 2:
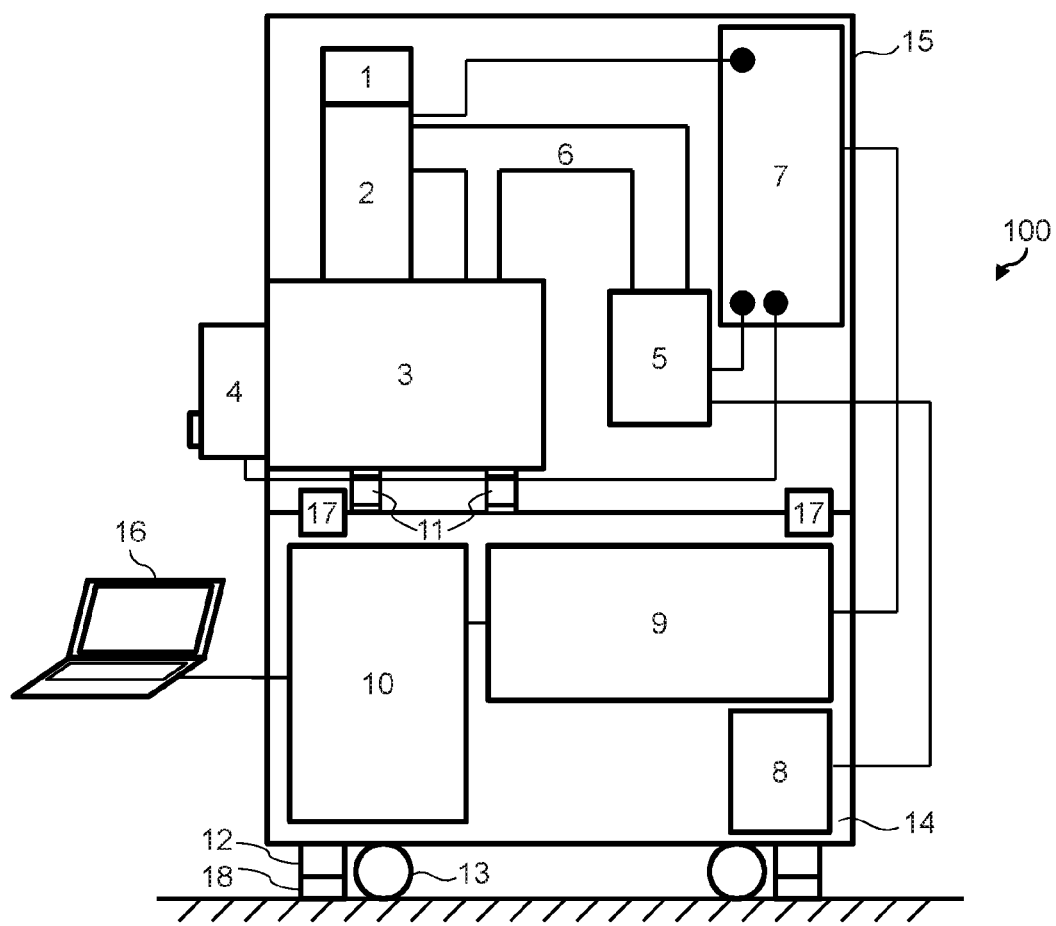
FIG. 2 is a view illustrating a state where a rotary pump 8 is accommodated inside an auxiliary unit 14.

FIG. 2 is a view illustrating a state where the rotary pump 8 is accommodated inside the auxiliary unit 14. In addition to a space for accommodating the power supply unit 9 and the control board 10, a space for accommodating the rotary pump 8 and other members can be disposed inside the auxiliary unit 14. In this manner, even in a case where the rotary pump 8 is installed outside the charged particle beam apparatus 100 when in use, these machines can be concurrently transported during the transportation. For example, when the main body unit 15 and the auxiliary unit 14 are separated from each other as in FIG. 6 (to be described later), the above-described space inside the auxiliary unit 14 can be used in order to accommodate a wire for connecting both unit in the space.

According to the desktop electron microscope in the related art, a position of the sample stage is 800 to 1,000 mm from the ground. A user 40 needs to raise his or her arm a little in order to pull out the sample stage while sitting on a chair 41. In addition, even in a case of a large-scale electron microscope in the related art, similarly to the desktop electron microscope, the position of the sample stage is approximately 1,000 mm from the ground. The user 40 needs to pull out the sample stage in a state where the user 40 raises his or her arm. In addition, according to the desktop electron microscope in the related art, a load plate is disposed below the sample chamber having the sample stage attached thereto, and the load plate is larger in the peripheral direction than the sample stage or the sample chamber (refer to FIG. 2 in PTL 1). Therefore, the user 40 has difficulties in moving close to the apparatus while sitting on the chair 41. The user 40 has to pull out the sample stage 4 after extending his or her arm or standing up from the chair 41. Therefore, the charged particle beam apparatus 100 according to the present embodiment employs a size which enables the user to reasonably carry out work.

Figure 3:
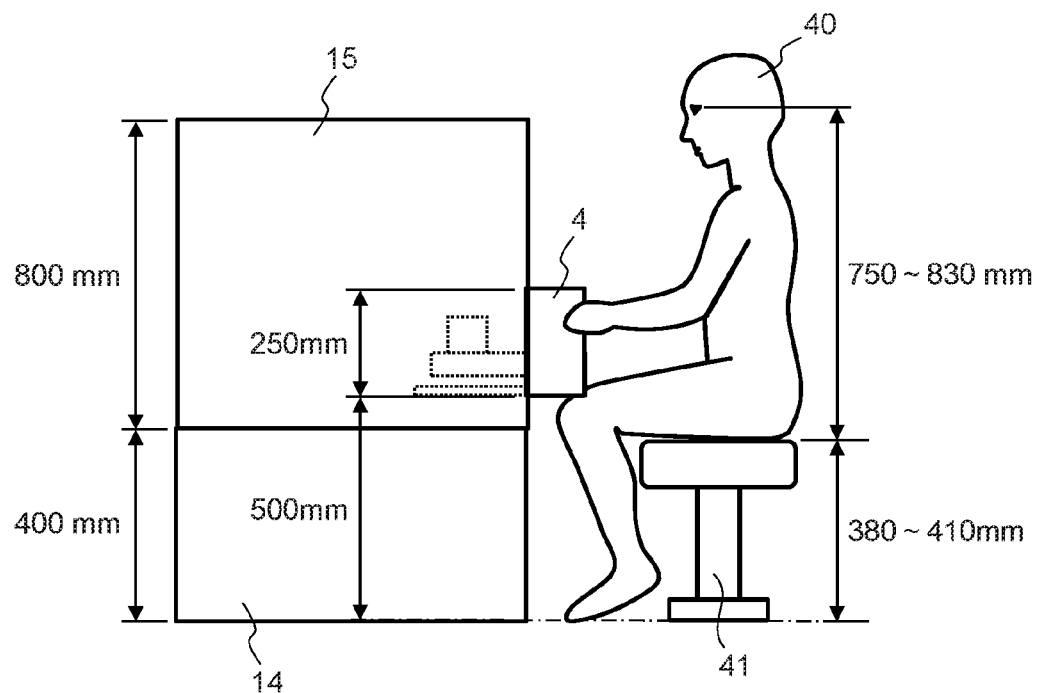
FIG. 3 is a side view illustrating a state where a user 40 sitting on a chair 41 operates the charged particle beam apparatus 100.

FIG. 3 is a side view illustrating a state where the user 40 sitting on the chair 41 operates the charged particle beam apparatus 100 FIG. 3 illustrates a size example of each unit. The height of the auxiliary unit 14 is substantially equal to the height of the chair 41 (In FIG. 3, the height of the chair 41 is 380 to 410 mm, and the height of the auxiliary unit 14 is 400 mm). The height of the main body unit 15 is 800 mm. When the user 40 replaces the sample, the sample stage 4 pulled out from the main body unit 15 is located at a position of 500 to 750 mm from the ground. This height is substantially equal to the height of the hand when the user 40 places the hand on the knee. Therefore, even in a state where the user 40 sits on the chair, the user 40 can comfortably pull out the sample stage 4.

Figure 4:
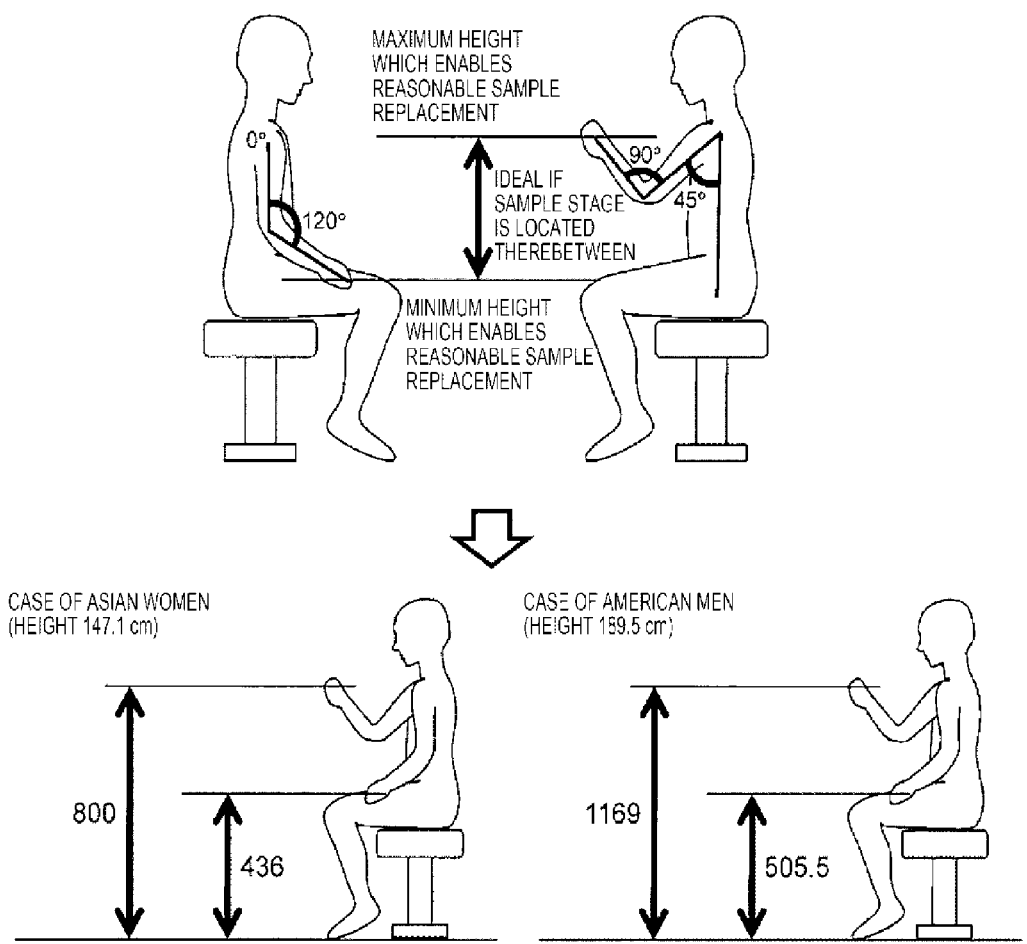
FIG. 4 is a view illustrating a height which enables reasonable sample replacement.

In Embodiment 1, the most important height in terms of usability is the height of the sample stage 4 (sample replacement position) where the user actually touches with the hand, and shows 640 mm. This height is determined, based on the idea as illustrated in FIG. 4.

As a big person's body size, men in a range of 95% are assumed (American men's height 189.5 cm). As a small person's body size, women in a range of 5% are assumed (Asian women's height 147.1 cm). In addition, as the maximum height of the hand in a posture which enables reasonable sample replacement, it is assumed that a shoulder's angle is set to 45 degrees forward from the body center and an elbow's angle is set to 90 degrees. As the minimum height of the hand, it is assumed that the shoulder's angle is set to zero degrees from the body center and the elbow's angle is set to 120 degrees. As a result, it is determined that a range of the height of the sample stage 4 which enables the big person to reasonably replace the sample is 505.5 mm to 1,169 mm, and that a range of the height of the sample stage 4 which enables the small person to reasonably replace the sample is 436 mm to 800 mm. The range of 505 mm to 800 mm where the two ranges overlap each other shows the optimum height of the sample stage 4 which enables not only the big person but also the small person to reasonably replace the sample. The height 640 mm of the sample stage 4 according to the present embodiment is a substantially intermediate position of an ideal range. Therefore, there is an advantageous effect in that many users 40 comfortably carry out work.

Figure 5:
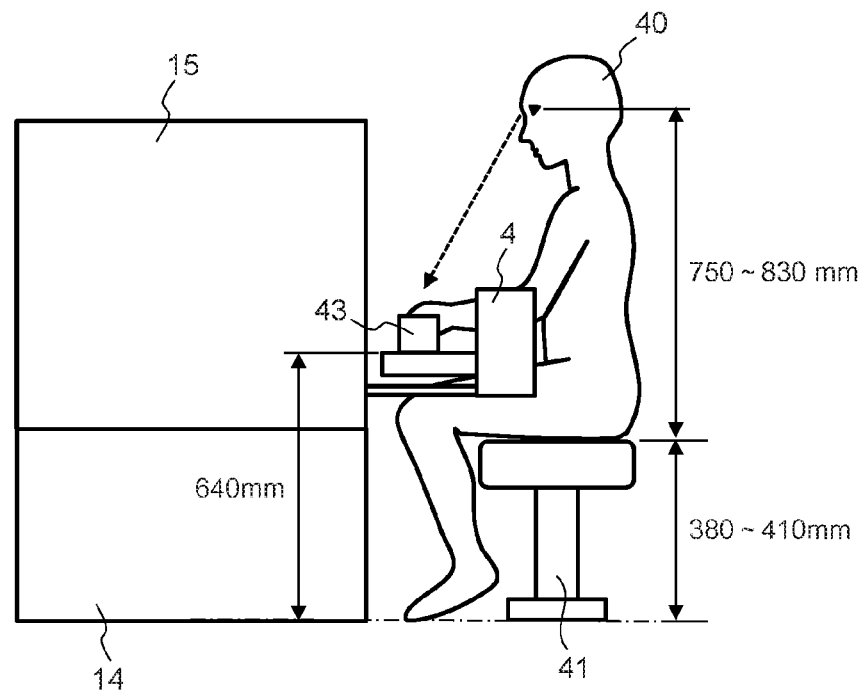
FIG. 5 is a view illustrating a size example when the user 40 pulls out a sample stage 4 from a main body unit 15.

FIG. 5 is a view illustrating a size example when the user 40 pulls out the sample stage 4 from the main body unit 15. The sample 43 is located at the position of 640 mm from the ground. Accordingly, similarly to when the sample stage 4 is pulled out, the user 40 can replace the sample 43 without raising the arm. In addition, when the sample stage 4 is pulled out, the user 40 can look down the sample 43 from above. Accordingly, the user 40 can observe a state of the sample 43 without detaching the sample 43 from the sample stage 4 or standing up by himself or herself. On the other hand, according to the desktop electron microscope or the large-scale electron microscope in the related art, the height of the sample 43 is approximately 1,000 mm from the ground. In a state of the user 40 sitting on the chair, the user 40 can only laterally or obliquely observe the sample 43. According to the size example illustrated in FIG. 5, it is possible to improve operability when the sample is replaced.

The footprint of the main body unit 15 is substantially the same as the footprint of the auxiliary unit 14. Accordingly, in a state where the sample stage 4 is pulled out from the main body unit 15, a space is affordable below the main body unit 15. Since the user 40 can place the feet into the space, the user 40 can more flexibly carry out work for the sample stage 4.

Figure 6:
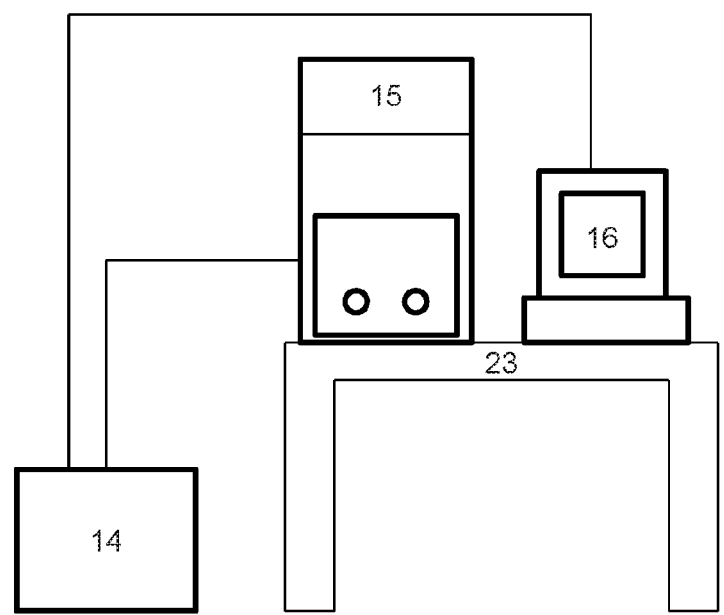
FIG. 6 is view illustrating an example in which main body unit 15 and the auxiliary unit 14 are separately installed.

FIG. 6 is view illustrating an example in which the main body unit 15 and the auxiliary unit 14 are separately installed. The fastening member 17 is detached therefrom. In this manner, the main body unit 15 and the auxiliary unit 14 can be installed at respectively separated positions. The main body unit 15 and the auxiliary unit 14 are connected to each other by a wire for control or power supply or a pipe for connecting a back pump. The auxiliary unit 14 and the computer 16 are connected to each other by a wire.

In an environmental case where a user stands and carries out work in a clean room, instead of a state where the two unit overlap each other as illustrated in FIG. 1, if the user uses the apparatus in a state where the main body unit 15 is placed on the desk 23 as illustrated in FIG. 6, the user can pull out the sample stage 4 without bending down when the user replaces the sample. In this way, depending on a user, a use state of the charged particle beam apparatus 100 differs. Accordingly, since each unit is configured to be attachable and detachable, the charged particle beam apparatus 100 can correspond to a wide range of user's environment. Furthermore, in a case where high magnification observation is performed in an environment where external vibrations are frequently generated, a vibration control table may be installed in the lower portion of the apparatus. According to the large-scale electron microscope in the related art, the overall apparatus has to be mounted on the vibration control table, and thus, a large-scale vibration control table is required. The apparatus can be mounted on the vibration control table by separating the main body unit 15 therefrom. Therefore, it is possible to minimize a size of the vibration control table or load withstanding.

Since the respective units are separated from each other, the respective units can also be loaded on a low-height vehicle during transportation. Therefore, the apparatus can be transported without using a large-size vehicle such as a truck. In this manner, the apparatus can be transported using a small-size vehicle. Therefore, not only the charged particle beam apparatus 100 can be conveniently transported, but also can be transported to a narrow place.

As described referring to FIGS. 3 to 5, the height is configured to be suitable for the user 40 to carry out work while sitting on the chair 41 in a state where the main body unit 15 is mounted on the auxiliary unit 14. However, since the main body unit 15 is separated and mounted on the desk 23, the height can be differently adjusted depending on the desk 23.

When the charged particle beam apparatus 100 partially fails, the charged particle beam apparatus 100 can be quickly recovered by replacing either the main body unit 15 or the auxiliary unit 14. The charged particle beam apparatus in the related art is large-sized and troublesome in transportation. However, the charged particle beam apparatus 100 according to Embodiment 1 can be transported using a small-size vehicle. Accordingly, mobility is satisfactory, and a user can quickly correspond to each unit. In addition, after repairing a failed unit, the user can replace the failed unit with a new one again. According to these characteristics, it is possible to improve an operation rate of the charged particle beam apparatus 100.

When the main body unit 15 and the auxiliary unit 14 are separated from each other, a wire for connecting both units is required. Since this wire causes noise, it is desirable that the wire is as short as possible. The wire can be shortened by disposing a member connected to both ends of the wire in an end inside the unit as possible. For example, it is conceivable that the power supply unit 9 is disposed close to the upper surface inside the auxiliary unit 14 and that the control board 7 is disposed close to the bottom surface inside the main body unit 15.

As described above, in the charged particle beam apparatus 100 according to Embodiment 1, while a characteristic that desktop installation is available is maintained, the power supply unit 9 or the control board 10 which does not affect the performance or function of the charged particle beam apparatus 100 is disposed inside the auxiliary unit 14 separated from the main body unit 15. In this manner, the main body unit 15 can be miniaturized. As the main body unit 15 is miniaturized, the charged particle beam apparatus 100 can be highly functionalized, and multi-functions can be realized so that the charged particle beam apparatus 100 can correspond to high vacuum and low vacuum.

The charged particle beam apparatus 100 according to Embodiment 1 can be used in a state where the main body unit 15 and the auxiliary unit 14 overlap each other, or can be used in a state where both units are separated from each other, for example, in a state where the main body unit 15 is installed on the desk. In a case where both units overlap each other, it is possible to prevent an installation area of the auxiliary unit 14 from being enlarged. In a case where both units are separated from each other, the main body unit 15 can be installed in a user's desired place such as a desk or a workbench. That is, it is possible to widely correspond to various installation environments.

The charged particle beam apparatus 100 according to the present embodiment can be transported without using a large-size vehicle since the respective units are separated from each other during the transportation. Therefore, it is possible to provide transportability which is the same as that of the desktop electron microscope while excellent performance is maintained.

Embodiment 2

Figure 7:
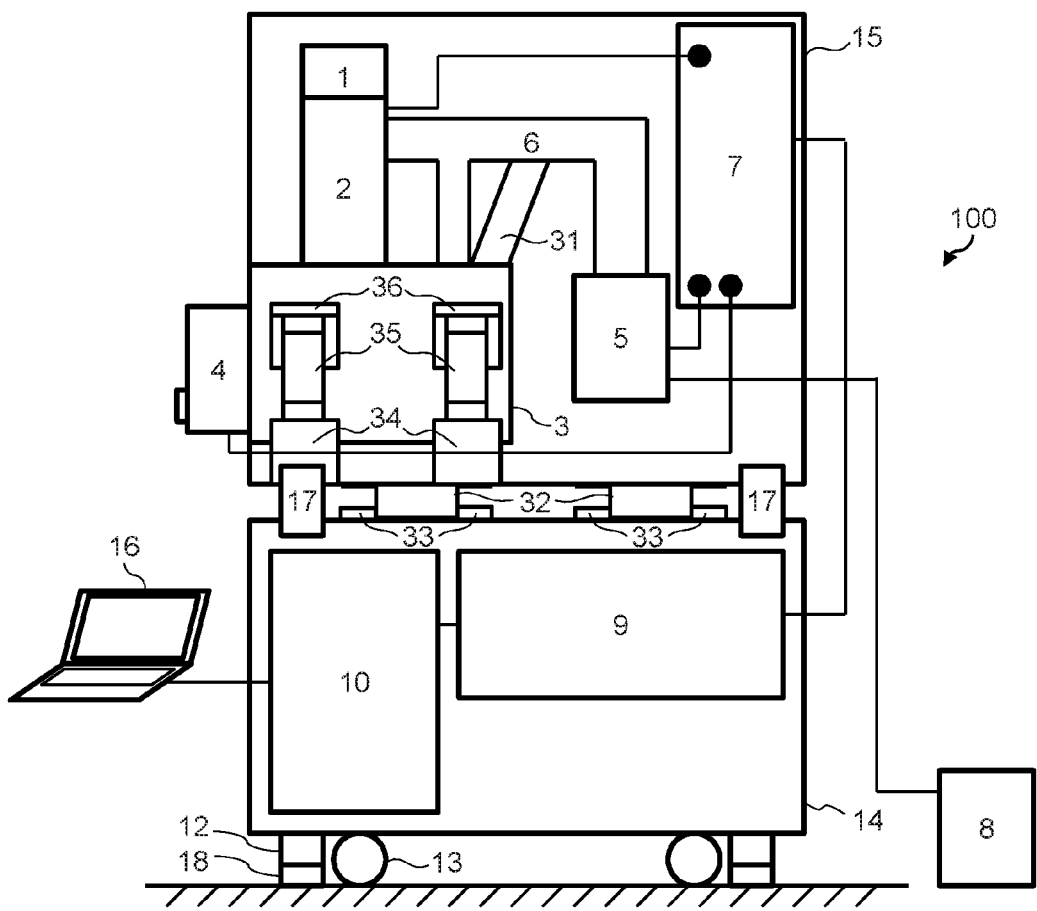
FIG. 7 is a side view illustrating an overall configuration of the charged particle beam apparatus 100 according to Embodiment 2.

FIG. 7 is a side view illustrating an overall configuration of the charged particle beam apparatus 100 according to the present embodiment. In the present embodiment, instead of the vibration control mount 11 described in Embodiment 1, a vibration control mount 35 is provided. Hereinafter, points different from those in Embodiment 1 will be mainly described.

The vibration control mount 35 is attached between a vibration control mount attachment member 36 fixed to a side surface of the sample chamber 3 and a vibration control mount base 34 fixed to a frame of the main body unit 15. In addition, an exhaust pipe support member 31 for supporting the exhaust pipe 6 is provided. One end of the exhaust pipe support member 31 is connected to the exhaust pipe 6, and the other end is connected to an outer wall of the sample chamber 3. Furthermore, a fork inserting guide 32 is disposed on the bottom surface of the main body unit 15, and a positioning member 33 is disposed on the upper surface of the auxiliary unit 14.

According to the electron microscope in the related art illustrated in FIG. 2 in PTL 1, the vibration control mount is disposed between the load plate disposed below the sample chamber and the frame. A natural frequency f of the vibration control mount is expressed by "$f=(k/m)^{1/2}$" if the weight placed on the vibration control mount is set to m and a spring constant of the vibration control mount is set to k. That is, the natural frequency f can be decreased by increasing the weight. If vibration amplitude is constant, as the frequency decreases, acceleration decreases. Accordingly, as the natural frequency f decreases, a vibration control effect is improved. As the load plate disclosed in PTL 1, a material such as iron is used. The weight of the material is as heavy as several 10 kg. Accordingly, the vibration control effect is excellent. However, according to the configuration described in Embodiment 1, the load plate is removed, and the sample chamber 3 or the electron optical system column 2 is miniaturized so that the main body unit 15 can be mounted on the desk.

Accordingly, the vibration control effect obtained by the vibration control mount 11 is weakened. In addition, if the vibration control mount 11 is disposed in the lower portion of the sample chamber 3, a size of the vibration control mount 11 is limited, thereby restraining the vibration control effect.

Therefore, according to Embodiment 2, the vibration control mount 35 is installed in a side portion of the sample chamber 3. In addition to this configuration, the vibration control mount base 34 fixed to the frame of the main body unit 15 and the vibration control mount attachment member 36 fixed to the side surface of the sample chamber 3 are provided. The side surface of the sample chamber 3 has a space to which a detector is attached. Accordingly, even in a case where the vibration control mount 35 is installed in the side portion of the sample chamber 3, the width of the main body unit 15 does not increase. That is, the vibration control mount 35 can become larger than that according to Embodiment 1 without increasing the size of the charged particle beam apparatus 100. Therefore, it is possible to improve the vibration control effect of the vibration control mount.

Figure 8:
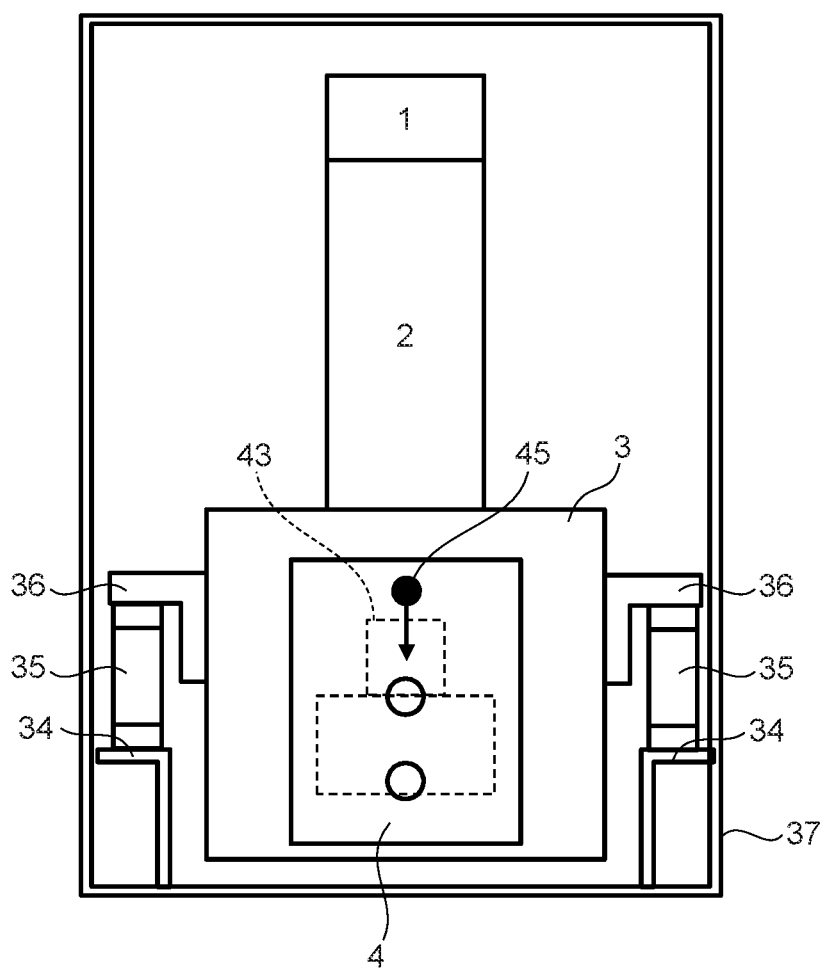
FIG. 8 is a front view of the main body unit 15.

FIG. 8 is a front view of the main body unit 15. The upper surface of the vibration control mount 35 is disposed so as to be substantially coincident with the height of the center of gravity 45 of the main body of the charged particle beam apparatus 100. In this manner, a vibration mode such as pitching and rolling is less likely to occur. In addition, the sample 43 is located at the height which is substantially the same as that of the upper surface of the vibration control mount 35 and the center of gravity 45. Therefore, even in a case where the vibration mode occurs, the rotation center is located near the sample 43, and the vibration amplitude near the sample 43 decreases. Accordingly, the influence of the vibrations can be minimized.

According to Embodiment 2, unlike FIG. 2 in PTL 1, the turbo-molecular pump 5 is not attached to the lower portion of the sample chamber 3, and is attached to the exhaust pipe 6 which is connected to the electron optical system column 2 or the sample chamber 3 and which extends rearward in the apparatus. In this manner, the apparatus is miniaturized by lowering the height of the main body unit 15.

In addition, the weight of the turbo-molecular pump 5 is approximately 3 kg. Accordingly, in a case where the turbo-molecular pump 5 is attached to the exhaust pipe 6, it becomes similar to a cantilever structure. Therefore, a two-freedom-degree vibration system using the vibration control mount 35 and the exhaust pipe 6 is formed, and an extra vibration mode appears, thereby causing a possibility that the vibration control performance may become poor. Therefore, according to Embodiment 2, the exhaust pipe support member 31 fixed to the sample chamber 3 is fastened to the exhaust pipe 6, thereby supporting the exhaust pipe 6. In this manner, it is possible to increase the natural frequency of the vibration system which is caused by the exhaust pipe 6 and the turbo-molecular pump 5. According to the above-described configuration, a difference increases between the natural frequency of the vibration system and the natural frequency of the vibration control mount 35. It is possible to minimize the influence on the vibration mode of the vibration control mount 35 which is exerted by the vibration mode of the exhaust pipe 6. In addition, the turbo-molecular pump 5 is a vibration source rotating at approximately 1,500 Hz during a steady operation. The natural frequency in a high-order mode of the exhaust pipe 6 is set to a frequency different from the rotation speed of the turbo-molecular pump 5 by the exhaust pipe support member 31. In this manner, it is possible to minimize the influence of the vibrations caused by the rotation of the turbo-molecular pump 5.

The main body unit 15 is lighter than that of the electron microscope in the related art. For example, the main body unit 15 has the weight of approximately 80 kg. Therefore, when the respective units are attached or detached, when the main body unit 15 is installed on the desk, and when the respective units are transported, it is assumed that a user uses a lifter. Therefore, two rectangular fork inserting guides 32 are fixed to the lower portion of the main body unit 15. In view of the center of gravity of the main body unit 15, it is desirable that the center of gravity of the main body unit 15 is located at the center of the two fork inserting guides 32. If a fork of the lifter is inserted into the fork inserting guides 32, the main body unit 15 can be lifted in a stable state. The position for inserting the fork is determined as the same position every time by the fork inserting guides 32. Accordingly, it is possible to ensure stability when the main body unit 15 is lifted without depending on a worker.

The positioning member 33 is a member which assists positioning when the main body unit 15 is mounted on the auxiliary unit 14. For example, a configuration is adopted in which a slit is disposed in the fork inserting guides 32 and the positioning member 33 is fitted to the slit. In this manner, the main body unit 15 can be mounted on the same position every time in FIG. 7, the positioning member 33 is disposed to be positioned in only the longitudinal direction (lateral direction toward the drawing) of the charged particle beam apparatus 100. However, a member for positioning the charged particle beam apparatus 100 in the lateral direction (depth direction toward the drawing) may be provided.

As described above, the charged particle beam apparatus 100 according to Embodiment 2 can improve vibration control performance while minimizing the size of the main body unit 15 by disposing the vibration control mount 35 in the side portion of the sample chamber 3. In addition, the influence of the vibrations caused by the turbo-molecular pump 5 can be minimized by providing a member for supporting the exhaust pipe 6.

The charged particle beam apparatus 100 according to Embodiment 2 includes the positioning member 33 and the fork inserting guide 32 in order to assist work for mounting the main body unit 15 on the auxiliary unit 14. These members enable a user to efficiently carry out work such as installation, separation, and combination of the respective units.

When the charged particle beam apparatus 100 is transported and installed, any one of the following aspects can be adopted in view of conditions such as an installation environment, transportation facilities, and a distance up to the installation environment. (a) The main body unit 15 is mounted on the auxiliary unit 14, and is transported by a transportation vehicle or the caster 13. (a1) Both units are separated from each other at the installation place, and are respectively installed. Alternatively, (a2) both units are installed while maintaining a state where the main body unit 15 is mounted on the auxiliary unit 14 at the installation place. (b) The auxiliary unit 14 and the main body unit 15 are separated from each other, and are individually transported by the transportation vehicle or the caster 13. (b1) Both units are installed while maintaining a state where both units are separated from each other at the installation place. Alternatively, (b2) the main body unit 15 is mounted and installed on the auxiliary unit 14 at the installation place.

Embodiment 3

In Embodiments 1 and 2, a configuration example has been described which includes the main body unit 15 and the auxiliary unit 14, In some cases, depending on a user's demand, it becomes necessary to additionally mount a configuration element such as a detector, and it becomes necessary to add a control board for operating the detector. Embodiment 3 adopts a configuration example in which the installation area is not changed while portability is maintained even in such circumstances. Hereinafter, points different from those according to Embodiments 1 and 2 will be mainly described.

Figure 9:
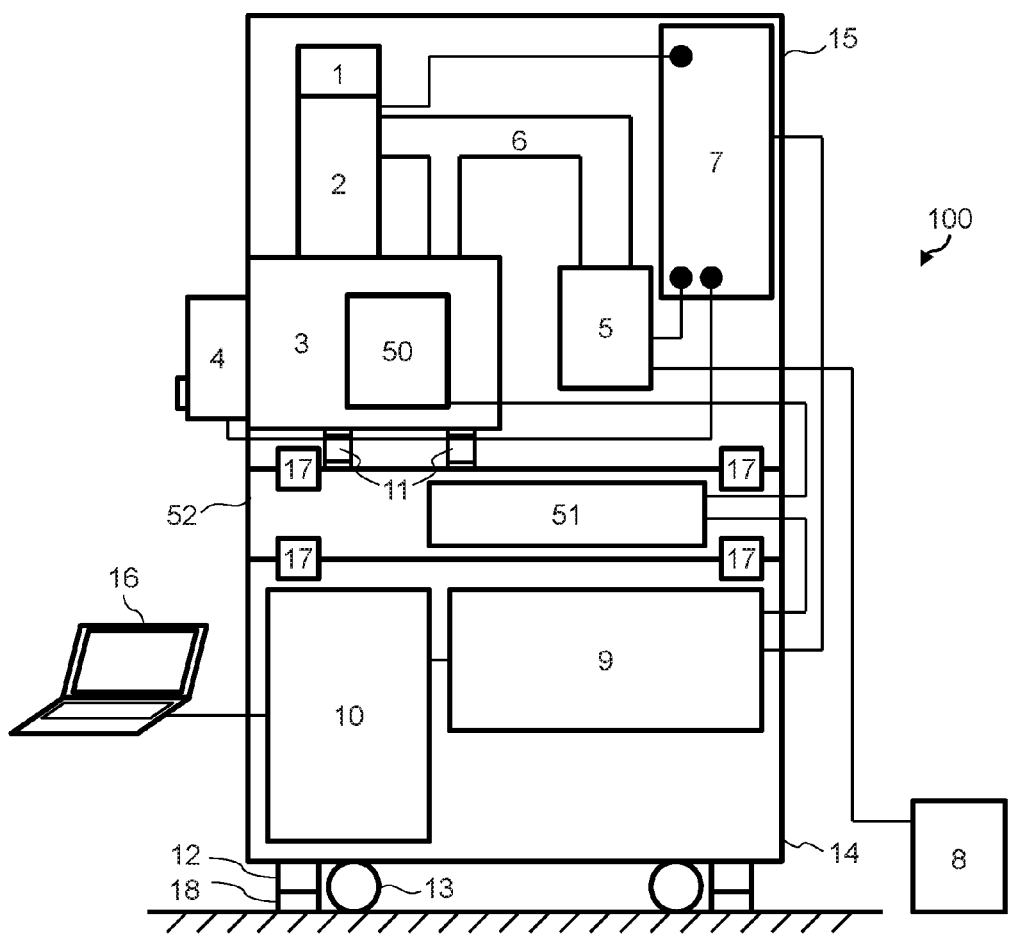
FIG. 9 is a side view illustrating an overall configuration of the charged particle beam apparatus 100 according to Embodiment 3.

FIG. 9 is a side view illustrating an overall configuration of the charged particle beam apparatus 100 according to Embodiment 3. An option detector 50 is installed inside the sample chamber 3. An option unit 52 which accommodates a control board 51 for controlling the option detector 50 is installed between the main body unit 15 and the auxiliary unit 14. The respective units can overlap each other. The main body unit 15 and the option unit 52, and the auxiliary unit 14 and the option unit 52 are fastened to each other by the fastening member 17. The option detector 50, the control board 51, and the power supply unit 9 are connected to each other by a wire. The footprint of the option unit 52 is substantially the same as the footprint of the main body unit 15 or the auxiliary unit 14.

The option unit 52 is added thereto. In this manner, without increasing the installation area of the overall charged particle beam apparatus 100, it is possible to add a configuration element which cannot be installed inside the main body unit 15 or inside the auxiliary unit 14. The configuration element accommodated inside the option unit 52 can be appropriately changed depending on a configuration element to be added. Specifically, those which are not accommodated in either the main body unit 15 or the auxiliary unit 14 in devices or members provided with functions by the charged particle beam apparatus 100 may be accommodated therein.

The number of configuration elements accommodated inside the option unit 52 is not limited to one. For example, other control boards or power sources can be accommodated. In addition, multiple option units 52 may be additionally installed. The respective units are configured so as to overlap each other. Accordingly, even if a function of the charged particle beam apparatus 100 is added by the option unit 52, the installation area is not changed, thereby maintaining familiar usability and design of the apparatus. In addition, all of the units can be transported at the same time by using the caster 13.

The option unit 52 can be used in order to adjust the height of the main body unit 15. Depending on a user, a physical condition or familiar usability varies. Accordingly, the option unit 52 is used as a height adjusting spacer, thereby allowing the height of the main body unit 15 from the ground to be variable. In this manner, it is possible to provide excellent operability for a wide range of users. In addition, since the option unit 52 is used as a vibration control table, it is possible to improve a vibration control effect.

Modification Example of Present Invention

Without being limited to the above-described embodiments, the present invention includes various modification examples. The above-described embodiments are provided in order to easily and specifically describe the present invention, and are not necessarily limited to those which include all of the described configurations. In addition, configurations according to a certain embodiment can be partially replaced with configurations according to the other embodiment. In addition, configurations according to the other embodiment can be added to configurations according to the certain embodiment. In addition, other configurations can be added to, deleted from, or replaced with configurations according to the respective embodiments.

REFERENCE SIGNS LIST

1: CHARGED PARTICLE BEAM SOURCE,
2: ELECTRON OPTICAL SYSTEM COLUMN,
3: SAMPLE CHAMBER,
4: SAMPLE STAGE,
5: TURBO-MOLECULAR PUMP,
6: EXHAUST PIPE,
7: CONTROL BOARD,
8: ROTARY PUMP,
9: POWER SUPPLY UNIT,
10: CONTROL BOARD,
11: VIBRATION CONTROL MOUNT,
12: LEG PORTION,
13: CASTER,
14: AUXILIARY UNIT,
15: MAIN BODY UNIT,
16: COMPUTER,
17: FASTENING MEMBER,
18: VIBRATION CONTROL MECHANISM
19: DESK,
31: EXHAUST PIPE SUPPORT MEMBER,
32: FORK INSERTING GUIDE,
33: POSITIONING MEMBER,
34: VIBRATION CONTROL MOUNT BASE,
35: VIBRATION CONTROL MOUNT,
36: VIBRATION CONTROL MOUNT ATTACHMENT MEMBER,
40: USER,
41: CHAIR,
43: SAMPLE,
45: CENTER OF GRAVITY,
50: OPTION DETECTOR,
51: CONTROL BOARD,
52: OPTION UNIT

The invention claimed is:

1. A charged particle beam apparatus comprising:
a main body unit; and
an auxiliary unit,
wherein the main body unit accommodates a charged particle source that generates a charged particle, an optical system that irradiates a sample with the charged particle, a sample stage on which the sample is mounted, and a sample chamber that accommodates the sample stage, and
wherein the auxiliary unit accommodates a power supply unit that supplies power to the main body unit, and is configured so that the main body unit can be detachably mounted on the auxiliary unit.

2. The charged particle beam apparatus according to claim 1,
wherein a bottom surface area of the main body unit is configured to be equal to or smaller than an upper surface area of the auxiliary unit.

3. The charged particle beam apparatus according to claim 1,
wherein when the main body unit is mounted on the auxiliary unit, a sample installation position of the sample stage is located at a position of 505 to 800 mm from the ground.

4. The charged particle beam apparatus according to claim 1,
wherein the auxiliary unit includes a transportation component for being transported in a state where the auxiliary unit is mounted on a floor surface.

5. The charged particle beam apparatus according to claim 1, further comprising:
a vibration control mechanism that restrains vibrations from being applied to the auxiliary unit, between the auxiliary unit and an installation surface.

6. The charged particle beam apparatus according to claim 1, further comprising:
a fastening member that fastens the main body unit and the auxiliary unit to each other when main body unit is mounted on the auxiliary unit.

7. The charged particle beam apparatus according to claim 1, further comprising:
an exhaust device that exhausts the optical system and the sample chamber,
wherein the auxiliary unit has a space for accommodating the exhaust device.

8. The charged particle beam apparatus according to claim 1,
wherein the main body unit includes a vibration control member that restrains vibrations of the main body unit from being propagated to the sample chamber.

9. The charged particle beam apparatus according to claim 8,
wherein the vibration control member is disposed on a side surface of the sample chamber.

10. The charged particle beam apparatus according to claim 1,
wherein the main body unit includes a guide mechanism that guides a lift arm used when a transportation machine transports the main body unit.

11. The charged particle beam apparatus according to claim 1,
wherein the auxiliary unit includes a positioning member that positions the main body unit when the main body unit is mounted on the auxiliary unit.

12. The charged particle beam apparatus according to claim 1, further comprising:
an exhaust device that exhausts the optical system and the sample chamber; and
an exhaust pipe that connects the exhaust device and the optical system, and the exhaust device and the sample chamber,
wherein the main body unit accommodates the exhaust device and the exhaust pipe, and
wherein the charged particle beam apparatus further includes an exhaust pipe support member in which one end is connected to the sample chamber and the other end is connected to the exhaust pipe.

13. The charged particle beam apparatus according to claim 1, further comprising:
an option unit that is disposed between the main body unit and the auxiliary unit;
a member that fastens the main body unit and the option unit to each other; and
a member that fastens the auxiliary unit and the option unit to each other.

14. The charged particle beam apparatus according to claim 13,
wherein the option unit accommodates those which do not accommodate any one of the main body unit and the auxiliary unit in devices provided with a function by the charged particle beam apparatus.

15. An installation method of a charged particle beam apparatus configured so that a main body unit can be detachably mounted on an auxiliary unit, comprising:

a transportation step of transporting the main body unit and the auxiliary unit to an installation place, individually after separating the main body unit for accommodating a charged particle source that generates a charged particle, an optical system that irradiates a sample with the charged particle, a sample stage on which the sample is mounted, and a sample chamber that accommodates the sample stage, from the auxiliary unit for accommodating a power supply unit that supplies power to the main body unit, or after mounting the main body unit on the auxiliary unit; and an installation step of respectively installing the main body unit and the auxiliary unit at the installation place.

16. The installation method according to claim 15, wherein in the transportation step, the main body unit and the auxiliary unit are separated from each other, and are individually transported, and wherein in the installation step, the main body unit and the auxiliary unit are respectively installed while both units are separated from each other.

17. The installation method according to claim 15, wherein in the transportation step, the main body unit and the auxiliary unit are separated from each other, and are individually transported, and wherein in the installation step, after the auxiliary unit is installed at the installation place, the main body unit is mounted on the auxiliary unit.

18. The installation method according to claim 15, wherein in the transportation step, in a state where the main body unit is mounted on the auxiliary unit, the charged particle beam apparatus is transported, and wherein in the installation step, the main body unit and the auxiliary unit are separated from each other, and are individually installed.

19. The installation method according to claim 15, wherein in the transportation step, in a state where the main body unit is mounted on the auxiliary unit, the charged particle beam apparatus is transported, and wherein in the installation step, while a state where the main body unit is mounted on the auxiliary unit is maintained, the charged particle beam apparatus is installed at the installation place.

* * * * *